US007577189B2

(12) United States Patent
Bella et al.

(10) Patent No.: US 7,577,189 B2
(45) Date of Patent: Aug. 18, 2009

(54) SELECTABLE HYBRID CIRCUITRY FOR TRANSMISSION SYSTEMS AND METHOD THEREFOR

(75) Inventors: Gregory L. Bella, Naperville, IL (US); Thomas J. McCabe, Romeoville, IL (US)

(73) Assignee: AT&T Intellectual Property I, L.P., Reno, NV (US)

( * ) Notice: Subject to any disclaimer, the term of this patent is extended or adjusted under 35 U.S.C. 154(b) by 0 days.

(21) Appl. No.: 11/584,888

(22) Filed: Oct. 23, 2006

(65) Prior Publication Data

US 2007/0071079 A1    Mar. 29, 2007

Related U.S. Application Data

(63) Continuation of application No. 10/647,817, filed on Aug. 25, 2003, now Pat. No. 7,145,943, which is a continuation-in-part of application No. 09/750,406, filed on Dec. 28, 2000, now Pat. No. 7,106,854.

(60) Provisional application No. 60/177,925, filed on Jan. 25, 2000.

(51) Int. Cl.
  *H04B 1/38* (2006.01)
  *H04L 27/00* (2006.01)
  *H04L 23/00* (2006.01)
  *H04M 11/00* (2006.01)

(52) U.S. Cl. .................. 375/222; 375/219; 375/295; 375/377; 379/93.01

(58) Field of Classification Search ......... 375/219–225, 375/295; 379/398, 404, 93.01, 1.03, 3, 345, 379/388.06, 390.04–391, 394, 402–403; 370/282
See application file for complete search history.

(56) References Cited

U.S. PATENT DOCUMENTS

| 4,096,362 | A | * | 6/1978 | Crawford | 379/403 |
|---|---|---|---|---|---|
| 4,278,848 | A | * | 7/1981 | Rizzo et al. | 379/403 |
| 4,530,086 | A | * | 7/1985 | Bogan et al. | 370/359 |
| 4,757,530 | A | * | 7/1988 | Arnon | 379/404 |
| 5,533,119 | A | * | 7/1996 | Adair et al. | 379/391 |
| 5,623,514 | A |   | 4/1997 | Arai | |
| 5,802,169 | A | * | 9/1998 | Frantz et al. | 379/398 |
| 6,208,732 | B1 | * | 3/2001 | Moschytz et al. | 379/402 |
| 6,229,814 | B1 | * | 5/2001 | McMillian et al. | 370/420 |
| 6,298,046 | B1 | * | 10/2001 | Thiele | 370/282 |
| 6,542,604 | B1 | * | 4/2003 | Blon et al. | 379/398 |
| 6,724,890 | B1 | * | 4/2004 | Bareis | 379/394 |
| 7,123,651 | B2 | * | 10/2006 | Altekar et al. | 375/222 |
| 2006/0067517 | A1 | * | 3/2006 | Lee | 379/402 |

FOREIGN PATENT DOCUMENTS

| EP | 0 806 852 A2 | 11/1997 |
|---|---|---|
| EP | 0 820 168 A2 | 1/1998 |
| EP | 0 828 363 A2 | 3/1998 |
| EP | 0 831 624 A2 | 3/1998 |

* cited by examiner

*Primary Examiner*—Tesfaldet Bocure
*Assistant Examiner*—Lawrence B Williams
(74) *Attorney, Agent, or Firm*—Toler Law Group

(57) ABSTRACT

A method is provided that includes selectively engaging impedance circuits one at a time from a plurality of selectable impedance circuits in-line with a communication channel. Each of the plurality of selectable impedance circuits includes a hybrid circuit responsive to a modem and to the communication channel. The method further includes determining a performance characteristic for each of the impedance circuits and selecting one of the plurality of selectable impedance circuits for transmission based on the respective performance characteristic.

17 Claims, 5 Drawing Sheets

SELECTABLE HYBRID CIRCUITRY FOR TRANSMISSION SYSTEMS AND METHOD THEREFOR

CROSS-REFERENCE TO RELATED APPLICATION(S)

This application is a Continuation Patent Application of and claims priority from U.S. patent application Ser. No. 10/647,817, filed on Aug. 25, 2003 now U.S. Pat. No. 7,145,943 and entitled "XDSL SYSTEM WITH IMPROVED IMPEDANCE CIRCUITRY," which was a Continuation-in-part Patent Application of and claimed priority from U.S. patent application Ser. No. 09/750,406, filed on Dec. 28, 2000 now U.S. Pat. No. 7,106,854 and entitled "XDSL SYSTEM HAVING SELECTABLE HYBRID CIRCUITRY," which claimed the benefit of U.S. Provisional Application No. 60/177,925 filed on Jan. 25, 2000 and entitled "XDSL SYSTEM HAVING SELECTABLE HYBRID CIRCUITRY," each of which are hereby incorporated by reference.

FIELD OF THE INVENTION

The present invention relates to data transmission systems, and more particularly, improved impedance circuitry for XDSL transmission systems.

BACKGROUND OF THE INVENTION

Digital Subscriber Line (DSL) is a technology which allows for simultaneous voice and data traffic to coexist over a communication channel comprising a standard telephone transmission line. Typically, the standard telephone transmission line comprises an unshielded twisted-pair of copper wire having a gage of 22-26 AWG. Twisted pairs, which can be used to connect a central telephone system to a subscriber's telephone system can support bandwidths up to 2 MHz through the use of digital signal processing (DSP) technology. Thus, they can be used for bandwidth-intensive applications, such as Internet access and video-on demand, as well as for carrying voice traffic. Frequency division multiplexing is used so that the plurality of signals, each occupying a different frequency band, can be simultaneously sent over the same transmission line.

Because there are different varieties of digital subscriber line technology, it is sometimes generally referred to as XDSL wherein the "X" refers to a specific DSL standard such as HDSL for high bit rate digital subscriber line or RADSL for rate adaptive digital subscriber line, etc. As the name implies, ADSL is asymmetric in that the data transmission rates differ in the upstream and downstream direction. In the context of a phone system, the downstream direction is defined as transmissions from the central office to a remote location that may be an end user such as a residence or business. The reverse signal corresponds to transmissions in an upstream direction, i.e., from the remote location to the central office. ADSL data traffic bandwidth for CAP (carrierless amplitude and phase) modulation is typically from about 35 kHz to 1.5 MHz. The bandwidth for ADSL data traffic using DMT (discreet multi-tone modulation) is from approximately 25 kHz to 1.5 MHz. A hybrid circuit is typically used in DSL systems to separate the upstream (transmit) and downstream (receive) signals on the twisted-pair transmission line.

Referring now to FIG. 1 there is shown an example of a typical analog front end of an ADSL remote unit (ATU-R). The hybrid circuitry 2 separates the signals received on the two-wire transmission line 4 into respective upstream and downstream communication channels. The upstream communication channel occupies a bandwidth from about 30 kHz to 138 kHz as represented by the band pass filter 6. The downstream communication channel occupies a bandwidth from approximately 170 kHz and upward as represented by the high pass filter 8. In such cases, the upstream and downstream frequency arranges are only separated by 32 kHz. Accordingly, it is very important that the impedance of the hybrid 2 matches the impedance of the transmission line 4 to prevent reflections, which can significantly degrade performance, particularly in the downstream direction. This can occur when high upstream signal power in the 138 kHz range is reflected back through a poor hybrid match of the transmission line into the downstream path thereby interfering with downstream signal recovery. Current ADSL modem implementations use only one impedance value for the hybrid circuit 2, which is specifically tuned to a characteristic line impedance of 100 ohms.

As a practical matter, however, the impedance of the transmission line is rarely 100 ohms due to line conditions such as bridge taps. A bridge tap is a non-terminated copper pair cable connected in parallel to the subscriber line. While a bridge tap has no effect on POTS service, it can significantly alter the impedance of the transmission line thereby creating an impedance mismatch with existing ADSL modem hybrids.

Thus, there exists a need for an XDSL system having improved impedance circuitry or impedance matching circuitry, which better matches the particular subscriber transmission line impedance.

BRIEF DESCRIPTION OF THE DRAWINGS

For a more complete understanding of this invention, reference should now be made to the embodiments illustrated in greater detail in the accompanying drawings and described below by way of examples of the invention.

In the drawings.

DETAILED DESCRIPTION

Broadly speaking, the invention includes selectable hybrid circuitry for an XDSL modem system wherein each hybrid circuit has a different termination impedance. Upon initialization, the XDSL modem synchronizes with the different hybrid circuits and records the upstream and downstream performance for each hybrid. After the initialization sequence is complete, the modem performs a final synchronization corresponding with the best performing hybrid circuit.

Figure 1:
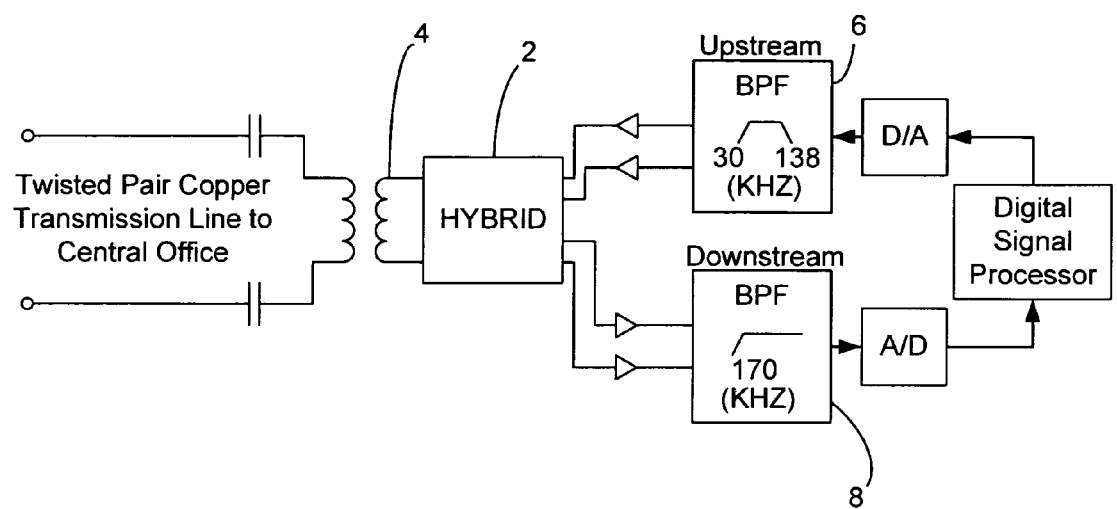
FIG. 1 is a block diagram of an XDSL system incorporating a hybrid circuitry according to the prior art.
Figure 2:
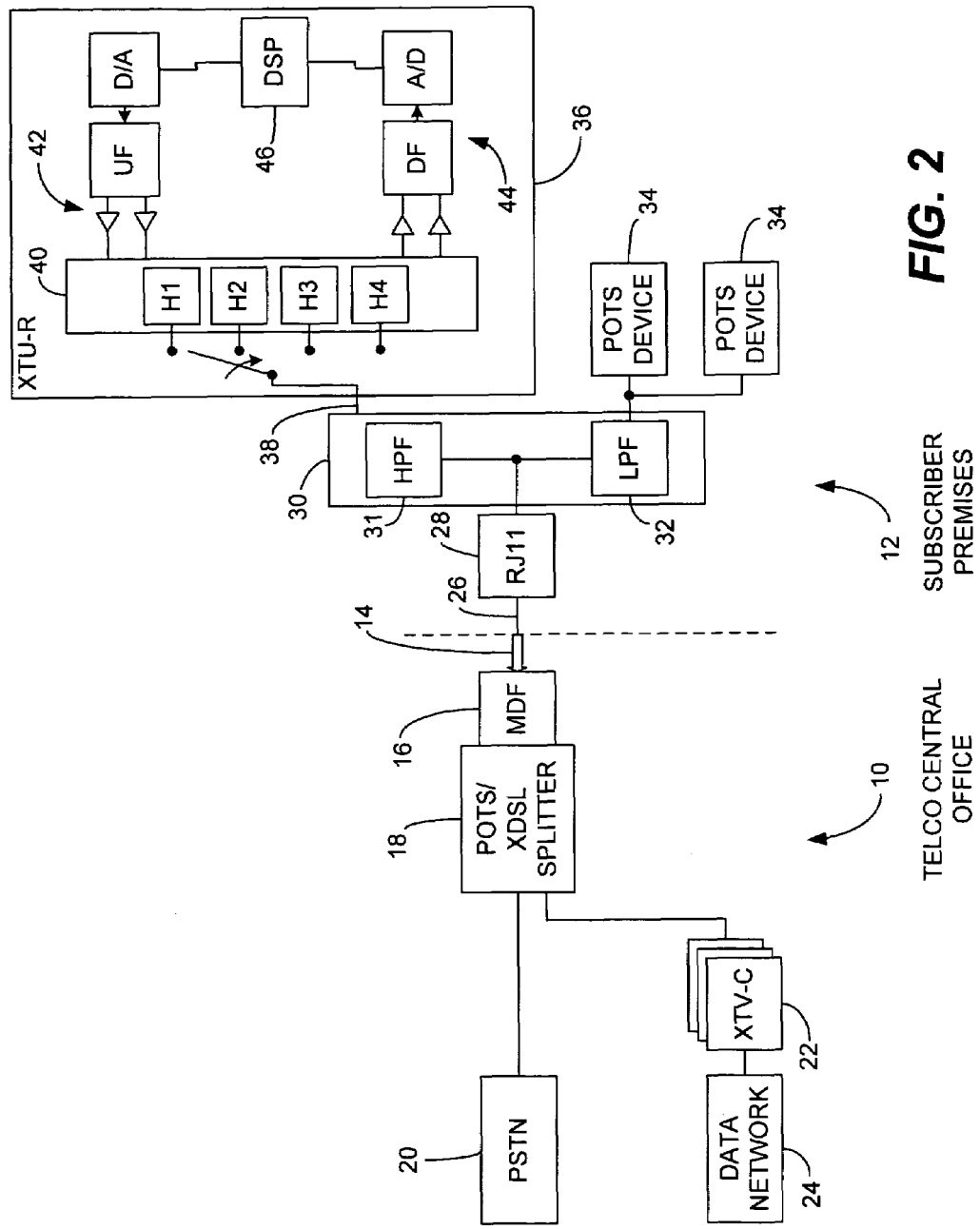
FIG. 2 is a block diagram of an XDSL system incorporating selectable hybrid circuitry according to one embodiment of the present invention.

Referring now to FIG. 2, there is shown a block diagram of an XDSL system incorporating selectable hybrid circuitry according to one embodiment of the present invention. The diagram of FIG. 2 is divided into two portions; one of which represents the telco central office 10 and the other which represents the subscriber premises 12. Communication channel 14 represents the main feeder cables to the telco outside plant. These cables interface with the main distribution frame (MDF) 16 within a central office 10. A splitter 18 divides the plain old telephone service (POTS) signals from the higher frequency XDSL signals. The POTS signals are routed through the central office switch to the worldwide public switched telephone network 20. The XDSL signals are routed to a plurality of XDSL transceiver units at the central office (XTU-C) 22 each of which corresponds to a respective XDSL transceiver unit remotely located (ATU-R) at a subscriber premises. The XTU-Cs 22 connect through the central office XDSL subscriber loop and data network interface to access the Internet ISP and other data networks 24.

At least a portion of the communication channel that connects the central office 10 with the subscribed premises 12 comprises a twisted-pair subscriber loop 26. The frequency bands transmitted along the twisted-pair subscriber loop 26 between a central office 10 and a subscriber premises 12 include the low frequency POTS band, the higher frequency upstream data communications band and the higher frequency downstream data communication band. The twisted-pair subscriber loop 26 connects to the subscriber premises through a standard RJ-11 modular connector 28. A splitter 30 comprising a high-pass filter 31 and a low-pass filter 32 may also be included at the subscriber premises to divide the higher frequency data communication bands from the lower frequency POTS communication band. The POTS signals are then transmitted to POTS devices 34 such as a telephone or facsimile machine. The higher frequency data signals are communicated to the XTU-R 36. Of course, in a splitter-less XDSL configuration, the splitter 30 would not be necessary and the XTU-R 36 would incorporate a device for filtering out the POTS band communication signals.

The XTU-R 36 comprises the selectable hybrid circuitry 40, which includes preferably four hybrid circuits H1 H2 H3 H4. In accordance with the control scheme described below, the hybrid circuit having the closest matching impedance to the two wire transmission line 38 is selected to be included in the transmission path. The output of the hybrid circuitry 40 separates the transmit and receive signals into an upstream data path 42 and downstream data path 44. The selection control of the hybrid circuitry 40 preferably implemented as firmware executed by the XTU-R controller, which comprises a microprocessor or a digital signal processor 46.

Figure 3:
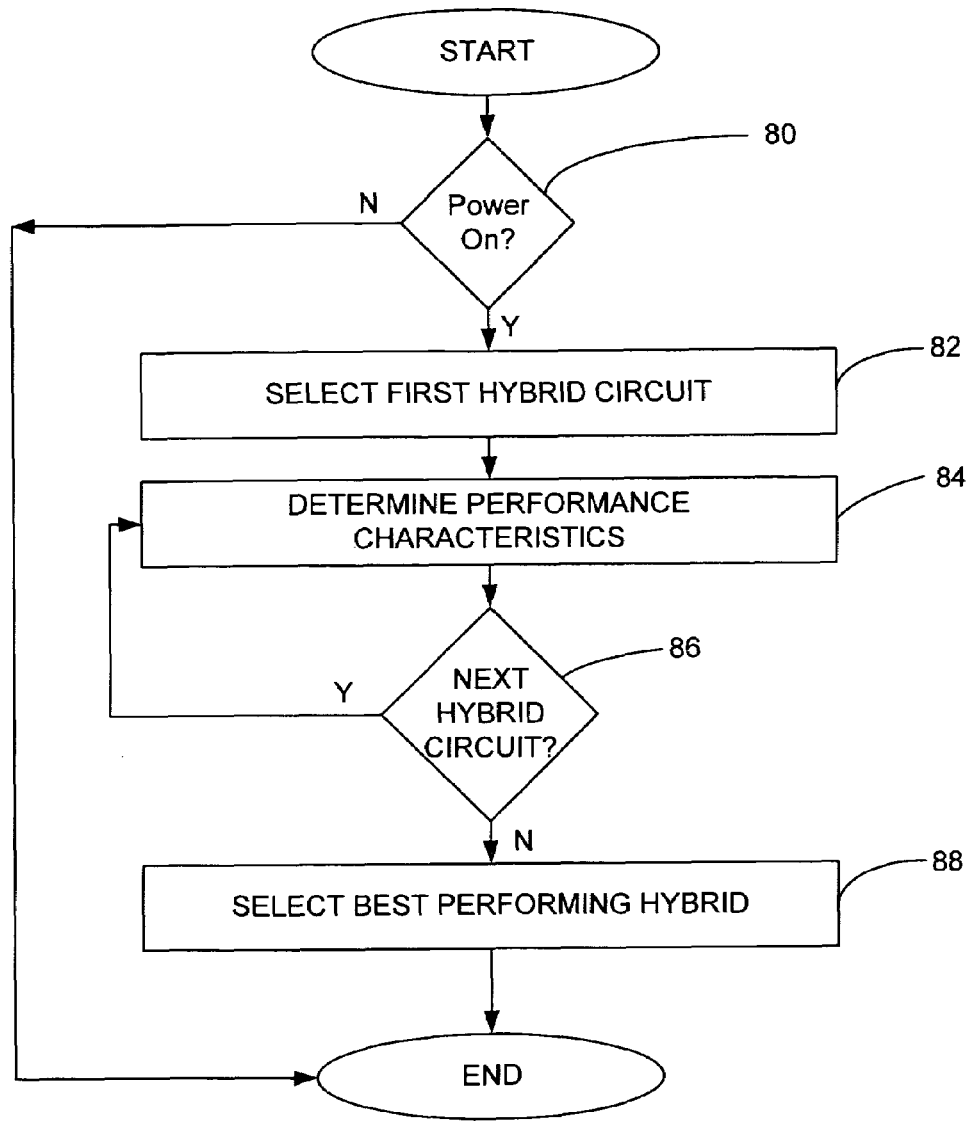
FIG. 3 is a logic flow diagram of one method of controlling the selectable hybrid circuitry of FIG. 2.

Referring now to FIG. 3, there is shown a logic flow diagram of one method of controlling the selectable hybrid circuitry 40 of FIG. 2. The logic begins in step 80 when the XTU-R modem is power cycled. Upon power-up, the logic enters a training routine to select the hybrid circuit characteristics, which provide the best transmission performance. Thus, in step 82, the first hybrid circuit H1 is selected. In step 84, the performance characteristics of the communication channel is determined utilizing the first hybrid circuit. The performance characteristics selected for analysis can be any known performance characteristic such as the downstream data rate, upstream data rate, the line attenuation, and the noise margin. The desired performance characteristics are then saved for later comparison with the performance characteristics of the remaining hybrid circuit configurations.

In step 86, the next hybrid circuit is selected such as, for example, H2 of FIG. 2. The line performance characteristics are then determined using hybrid circuit H2. This continues until all of the hybrid circuit configurations within the selectable hybrid 40 are exhausted. Alternatively, if the determined performance characteristics of, for example, the first hybrid circuit, exceed a predetermined threshold line characteristic, no further hybrid circuit configurations need be tested. The logic then continues to step 88 wherein the hybrid circuit configuration having the best performance as determined by the selected performance criteria is selected as the configuration for all subsequent transmissions. Again, alternatively, if during the testing phase, a hybrid circuit configuration exceeds a predetermined line performance, that hybrid circuit configuration under consideration can be selected as the hybrid circuit configuration for all subsequent transmissions.

Preferably, the performance and selection analysis is performed only when the modem is power cycled. In this way, any disturbances that cause a retrain such as a line disconnect, will not result in a hybrid selection change.

Figure 4:
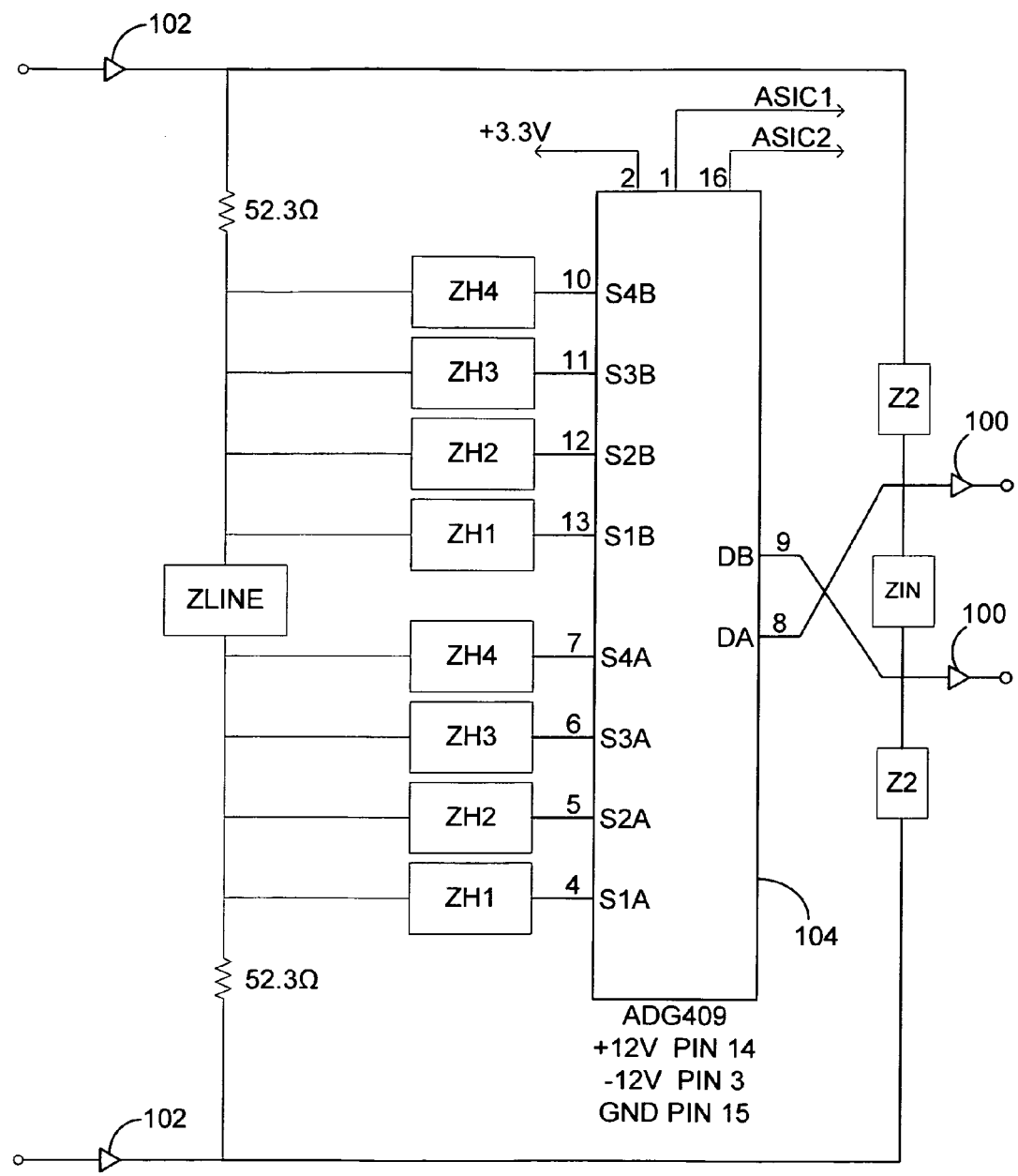
FIG. 4 is a block diagram of an XDSL system incorporating selectable hybrid circuitry according to another embodiment of the present invention.

Referring now to FIG. 4, there is shown a selectable hybrid circuit according to another embodiment of the present invention. The configuration shown in FIG. 4 is an analog front end topology which supports an Alcatel chip set, analog front end for an ADSL receiver unit. For such a configuration, Z2 represents an impedance equal to 787 ohms+100 nF. ZIN represents the input impedance of the downstream receive path high pass filter. Drivers 100 are receive path downstream drivers. ZLINE represents the input impedance of the two wire transmission line. Drivers 102 represent the transmit path upstream drivers.

The hybrid circuitry comprises an analog switch 104 and corresponding plurality of impedance values ZH1, ZH2, ZH3, ZH4. Preferably, the switch 104 is an analog switch such as model number ADG4O9 available from Analog Devices, Inc. The ADG4O9 switch has a resistance of approximately 40 ohms, and this must be taken into account when selecting the corresponding hybrid impedances ZH1 through ZH4. ASIC1 and ASIC2 are binary select lines for the switch 104. These binary select lines are controlled by the processor which cycles through a binary count on successive hybrid circuit selections and performance determinations to select the best hybrid circuit configuration.

Preferably, the values for ZH1 through ZH4 are selected to provide the closest impedance match to the most common impedance characteristics of subscriber loops. As described above, bridge taps are found commonly within the public switch telephone network. According to studies, approximately 75% of all subscriber loops have some type of bridge tap, and approximately 33% of all loops have bridge taps between 250 and 500 feet from the subscriber premises. The existence of bridge taps can significantly alter the impedance characteristics of the subscriber loop. For example, a 15 kFT, 26 AWG cable without a bridge tap exhibits an input impedance of 118 ohms at 200 kHz. With a 350 ft bridge tap, however, the impedance changes to 71 ohms. This represents a nearly 40% impedance change. With the assumptions shown in FIG. 4 for the Alcatel chip set and the ADG 409 switch, the preferred values for ZH1 through ZH4 are as follows:

$ZH1=750\Omega//(525\Omega+2000 \text{ pF})$.

This value for ZH1 best matches an 8 to 20 kft 24/26 AWG cable with a 350 ft bridge tap.

Preferably, the value of ZH2 is 620Ω//(320Ω+4200 pF). This value of ZH2 best matches the impedance characteristics of a 12-15 kft, 26 AWG cable with a 350 ft bridge tap.

Preferably, the value of ZH3 is 460Ω//(1200Ω+520 pF). This value of ZH3 best matches a 24/26 AWG cable without bridge taps.

Finally, the preferred value of ZH4 is 620Ω//(680Ω+2200 pF). This value for ZH4 represents a compromise impedance, which combines characteristics of the other three impedance values.

Figure 5:
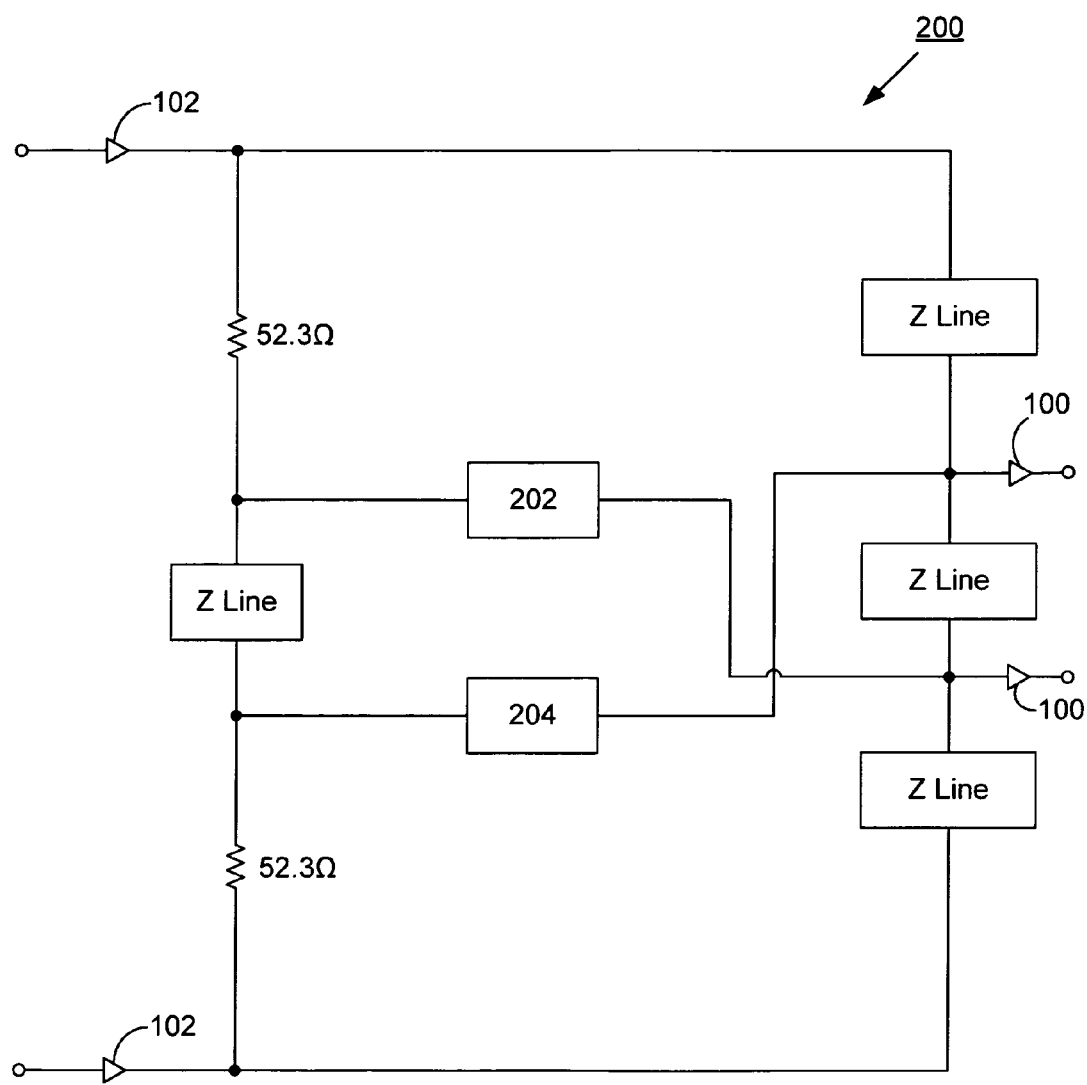
FIG. 5 is a block diagram of an improved impedance circuit utilizing a compromise impedance.

An alternative impedance matching circuit 200 is shown in FIG. 5. The circuit 200 includes first and second fixed impedances 202, 204. Each of the impedances 202, 204 also has a value that is a compromise to allow satisfactory performance, regardless of the line impedance presented to the circuit 200. In one embodiment shown in FIG. 5, the impedances 202, 204 each have a value approximately equal to 620Ω//(680Ω+ 2200 pF). Of course, this value may vary, depending on a variety of circuit variables, such as the presence or absence of bridge taps on the transmission line, the physical length of the transmission line, etc.

Thus, the invention of FIG. 5 does not include either a switch or controller, nor a variety of selectable impedances. Accordingly, the invention is less complex and less expensive to manufacture. Moreover, the circuit 200 allows for quicker initialization, since the device need not test a plurality of different impedances during set up. Consequently, a customer using a computer need not wait as long initially before her or his computer begins transmitting and receiving data over the transmission line.

Of course, the number of hybrid circuit configurations shown and the value of each corresponding impedance is merely exemplary. It should be understood that more or less than four hybrid circuit configurations are possible and that each circuit configuration can have a different impedance value. The more circuit configurations implemented for a selectable hybrid design, however, the slower the analysis upon power-up since the performance of each hybrid configuration is tested to select the best performing hybrid configuration.

From the foregoing, it can seen that there has been brought to the art a new and improved selectable hybrid circuit for use in an XDSL system which provides improved performance by more closely matching the impedance characteristics of the twisted-pair subscriber loop. While the invention has been described in connection with one or more embodiments, it should be understood that the invention is not limited to those embodiments. On the contrary, the invention covers all alternatives, modifications, and equivalence, as may be included within the spirit and scope of the appended claims.

What is claimed is:

1. A method comprising:
   selectively coupling each of a plurality of hybrid circuits of a Digital Subscriber Line (DSL) modem, one at a time, to a communication channel that is coupled to the DSL modem;
   determining a corresponding performance characteristic associated with each hybrid circuit of the plurality of hybrid circuits, wherein the corresponding performance characteristic comprises an upstream data rate or a downstream data rate; and
   including a particular hybrid circuit selected from the plurality of hybrid circuits in a DSL communication path that includes the communication channel, wherein the particular hybrid circuit is selected based at least in part on the corresponding performance characteristic.

2. The method of claim 1, wherein the particular hybrid circuit of the plurality of hybrid circuits has an associated impedance value substantially equal to a characteristic line impedance of a portion of the communication channel coupled to the DSL modem, the portion comprising a two-wire transmission line.

3. The method of claim 1, wherein the particular hybrid circuit of the plurality of hybrid circuits has an impedance substantially equal to a characteristic line impedance of a twisted-pair subscriber loop portion of the communication channel, wherein the twisted-pair subscriber loop portion includes a bridged tap.

4. The method of claim 1, wherein the particular hybrid circuit is selected by:
   comparing the corresponding performance characteristic of the particular hybrid circuit to a predetermined threshold line characteristic; and
   identifying the particular hybrid circuit when the corresponding performance characteristic associated with the particular hybrid circuit exceeds the predetermined threshold line characteristic.

5. The method of claim 1, wherein the method is performed during power cycling of the DSL modem.

6. The method of claim 1, wherein the corresponding performance characteristic further comprises a line attenuation.

7. The method of claim 1, wherein the corresponding performance characteristic further comprises a noise margin.

8. The method of claim 1, wherein the particular hybrid circuit has an impedance value substantially equal to an impedance characteristic of the communication channel.

9. The method of claim 1, wherein the selection of the particular hybrid circuit is based at least in part upon a comparison of the corresponding performance characteristic of the particular hybrid circuit with the corresponding performance characteristic of another of the plurality of hybrid circuits.

10. The method of claim 1, wherein each hybrid circuit has a corresponding impedance value, wherein a difference between the impedance value corresponding to the particular hybrid circuit and a characteristic impedance of a twisted-pair subscriber loop of the communication channel is less than a difference between the corresponding impedance value of any other hybrid circuit of the plurality of hybrid circuits and the characteristic impedance of the twisted-pair subscriber loop.

11. A system comprising:
   a Digital Subscriber Line (DSL) modem including:
   a plurality of hybrid circuits;
   a switch coupled to a DSL communication channel that is external to the DSL modem, the switch to selectively couple each of the hybrid circuits of the plurality of hybrid circuits to the communication channel, one at a time;
   first logic coupled to the communication channel to determine a corresponding performance characteristic associated with each hybrid circuit; and
   second logic to select a particular hybrid circuit of the plurality of hybrid circuits, wherein the particular hybrid circuit is to be coupled to the communication channel during a DSL transmission, wherein the selection is based at least in part on the corresponding performance characteristic associated with the particular hybrid circuit, wherein the performance characteristic comprises an upstream data rate or a downstream data rate.

12. The system of claim 11, wherein the first logic and the second logic are accessible by a digital signal processor that executes the first logic and the second logic.

13. The system of claim 11, wherein the performance characteristic further comprises a noise margin.

14. The method of claim 1, wherein only one of the plurality of hybrid circuits at a time can be included in the DSL communication path.

15. The system of claim 11, wherein the system is configured to permit inclusion of only one of the plurality of hybrid circuits at a time into a communication path that includes the DSL communication channel.

16. The system of claim 11, wherein the switch comprises an analog switch.

17. The system of claim 11, wherein the selection of the particular hybrid circuit is performed only during a power cycling of the DSL modem.

\* \* \* \* \*